(12) United States Patent
Duan et al.

(10) Patent No.: US 9,428,424 B2
(45) Date of Patent: Aug. 30, 2016

(54) CRITICAL CHAMBER COMPONENT SURFACE IMPROVEMENT TO REDUCE CHAMBER PARTICLES

(71) Applicant: Applied Materials, Inc., Santa Clara, CA (US)

(72) Inventors: Ren-Guan Duan, Fremont, CA (US); Juan Carlos Rocha-Alvarez, San Carlos, CA (US); Ramprakash Sankarakrishnan, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 82 days.

(21) Appl. No.: 14/623,402

(22) Filed: Feb. 16, 2015

(65) Prior Publication Data

US 2015/0251961 A1    Sep. 10, 2015

Related U.S. Application Data

(60) Provisional application No. 61/948,362, filed on Mar. 5, 2014.

(51) Int. Cl.

| B01J 19/12 | (2006.01) |
|---|---|
| C04B 41/00 | (2006.01) |
| F27D 19/00 | (2006.01) |
| F27D 7/06 | (2006.01) |
| C04B 41/80 | (2006.01) |
| C23C 14/56 | (2006.01) |
| C23C 16/44 | (2006.01) |
| F27B 17/00 | (2006.01) |
| C04B 35/111 | (2006.01) |
| C04B 35/488 | (2006.01) |
| C04B 35/50 | (2006.01) |
| C04B 35/505 | (2006.01) |
| C04B 35/565 | (2006.01) |
| C04B 35/581 | (2006.01) |
| C04B 35/587 | (2006.01) |
| C03C 23/00 | (2006.01) |

(52) U.S. Cl.
CPC ......... *C04B 41/0081* (2013.01); *C03C 23/007* (2013.01); *C04B 35/111* (2013.01); *C04B 35/488* (2013.01); *C04B 35/50* (2013.01); *C04B 35/505* (2013.01); *C04B 35/565* (2013.01); *C04B 35/581* (2013.01); *C04B 35/587* (2013.01); *C04B 41/009* (2013.01); *C04B 41/80* (2013.01); *C23C 14/564* (2013.01); *C23C 16/4401* (2013.01); *F27B 17/0025* (2013.01); *F27D 7/06* (2013.01); *F27D 19/00* (2013.01); *C04B 2235/3225* (2013.01); *C04B 2235/6562* (2013.01); *C04B 2235/6565* (2013.01); *C04B 2235/6567* (2013.01); *C04B 2235/96* (2013.01); *F27D 2007/063* (2013.01); *F27D 2019/0028* (2013.01)

(58) Field of Classification Search
CPC ............ B01J 19/12; B01J 19/08; C01F 7/02; C01F 7/14; C01F 7/47
USPC ..................... 422/286.3; 23/305 A
See application file for complete search history.

(56) References Cited

U.S. PATENT DOCUMENTS

| 4,439,248 | A | 3/1984 | Herchenroeder et al. |
|---|---|---|---|
| 6,194,083 | B1 | 2/2001 | Yasuda et al. |
| 6,589,353 | B1 | 7/2003 | Chen et al. |
| 6,783,875 | B2 | 8/2004 | Yamada et al. |
| 6,805,952 | B2 | 10/2004 | Chang et al. |
| 6,933,254 | B2 | 8/2005 | Morita et al. |
| 6,942,929 | B2 | 9/2005 | Han et al. |
| 7,696,117 | B2 | 4/2010 | Sun et al. |
| 8,034,734 | B2 | 10/2011 | Sun et al. |
| 2001/0007645 | A1 | 7/2001 | Honma |
| 2008/0264564 | A1 | 10/2008 | Sun et al. |
| 2008/0264565 | A1 | 10/2008 | Sun et al. |
| 2009/0214825 | A1 | 8/2009 | Sun et al. |
| 2009/0297718 | A1 | 12/2009 | Sarrafi-Nour et al. |
| 2012/0034469 | A1 | 2/2012 | Sun et al. |
| 2013/0216783 | A1 | 8/2013 | Duan et al. |
| 2013/0216821 | A1 | 8/2013 | Sun et al. |

FOREIGN PATENT DOCUMENTS

| JP | 2001-308011 A | 11/2001 |
|---|---|---|
| KR | 10-2001-0046344 A | 6/2001 |

OTHER PUBLICATIONS

Bhatia et al, Mechanisms of Ceramic Coating Deposition in Solution-precursor, Plasma Spray, J. Mater. Res., vol. 17, No. 9, Sep. 2002, Materials Research Society, 10 pp.

Taffner et al, Preparation and Microstructural Analysis of High-Performance Ceramics, 2004 ASM International, ASM Handbook vol. 9: Metallography and Microstructures (#06044G), 11 pp.

International Search Report and Written Opinion for International Application No. PCT/US2015/013917 dated Apr. 28, 2015.

*Primary Examiner* — Edward Johnson
(74) *Attorney, Agent, or Firm* — Patterson & Sheridan, LLP

(57) ABSTRACT

Embodiments described herein generally relate to apparatus and methods for thermally treating chamber components for use in ultraviolet semiconductor processing chambers. Thermal treatment of chamber components comprising unitary ceramic or glass articles may reduce the probability of particle generation when the chamber components are exposed to corrosive environments, such as exposure to ultraviolet light and ozone/oxygen radicals. A method of thermally treating chamber components includes heating the unitary article at an acceptable ramp rate to a desired temperature for a desired time period and subsequently cooling the unitary article at the ramping rate.

20 Claims, 8 Drawing Sheets

CRITICAL CHAMBER COMPONENT SURFACE IMPROVEMENT TO REDUCE CHAMBER PARTICLES

CROSS-REFERENCE TO RELATED APPLICATIONS

This application claims benefit of U.S. provisional patent application No. 61/948,362, filed Mar. 5, 2014, which is incorporated herein by reference in its entirety.

BACKGROUND

1. Field

Embodiments described herein generally relate to heat treatment of unitary ceramic articles for use in ultraviolet (UV) semiconductor processing chambers.

2. Description of the Related Art

In the semiconductor industry, devices are fabricated by a number of manufacturing processes which produce structures having continually decreasing dimensions. Some manufacturing processes, such as UV curing processes and ozone ($O_3$) cleaning processes, expose various chamber components to corrosive environments which may corrode the processing chambers or the surfaces of the chamber components. The corrosion may generate particles which frequently contaminate the devices being produced.

As device geometries shrink, susceptibility to defects increases and particle contaminant requirements become more stringent. Accordingly, allowable levels of particle contamination may be reduced. The minimize particle contamination introduced by UV and ozone exposure, chamber materials have been developed that are generally resistant to the corrosive UV and ozone environments. Examples of such materials include ceramics composed of $Al_2O_3$, AlN, SiC, $Y_2O_3$, quartz, $ZrO_2$, and the like. However, the corrosion resistance properties of these ceramic materials may be insufficient for certain applications where particle contamination plays a pronounced role in device functionality. Various cleaning techniques, such as wet cleaning with acid, utilized to remove particles from chamber components may also be ineffective at removing particles and further preventing particle generation to the degree necessary to ensure defect-free device manufacturing.

Thus, what is needed in the art are apparatus and methods for chamber components having desirable properties which reduce particle generation in corrosive environments.

SUMMARY

In one embodiment, a method for thermally treating UV chamber components is provided. The method comprises providing a unitary ceramic article and heating the unitary ceramic article to a temperature range between about 1000° C. and about 1800° C. at a first ramping rate of between about 0.1° C./minute and about 20° C./minute. The unitary ceramic article is thermally treated for a duration of between about 0.5 hours and about 24 hours and the unitary ceramic article is cooled at a second ramping rate of between about 0.1° C./minute and about 20° C./minute.

In another embodiment, a method for thermally treating UV chamber components is provided. The method comprises providing a unitary glass article and heating the unitary glass article to a temperature range between about 1000° C. and about 1800° C. at a first ramping rate of between about 0.1° C./minute and about 20° C./minute. The unitary glass article is thermally treated for a duration of between about 0.5 hours and about 24 hours and the unitary glass article is cooled at a second ramping rate of between about 0.1° C./minute and about 20° C./minute.

In yet another embodiment, thermally treated UV chamber component is provided. The thermally treated UV chamber component is prepared by a process comprising providing a unitary ceramic or glass article and heating the unitary ceramic or glass article to a temperature range between about 1000° C. and about 1800° C. at a first ramping rate of between about 0.1° C./minute and about 20° C./minute. The unitary ceramic or glass article is thermally treated for a duration of between about 0.5 hours and about 24 hours and the unitary ceramic or glass article is cooled at a second ramping rate of between about 0.1° C./minute and about 20° C./minute.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to apparatus and methods for thermally treating chamber components for use in ultraviolet semiconductor processing chambers. Thermal treatment of chamber components comprising unitary ceramic or glass articles may reduce the probability of particle generation when the chamber components are exposed to corrosive environments, such as exposure to ultraviolet light and ozone/oxygen radicals. A method of thermally treating chamber components includes heating the unitary article at an acceptable ramp rate to a desired temperature for a desired time period and subsequently cooling the unitary article at the ramping rate.

Thermal treatment of chamber components may minimize or eliminate surface particles on the chamber components. The thermal treatment may reduce the prevalence of high energy bonds (broken bonds) at or near the surface of a chamber component and produce a significantly lower amount of particle contamination when utilized in UV semiconductor processes where photons or oxygen radicals are present. Thus, semiconductors manufactured using the thermally treated chamber components may have a lower defect count.

Although embodiments provided herein are described with regard to UV semiconductor processes, it is contemplated that the chamber components may provide for reduced particle contamination is various other types of chambers, such as chemical vapor deposition (CVD) chambers, physical vapor deposition (PVD) chambers, plasma enhance chemical vapor deposition (PECVD) chambers, plasma enhanced physical vapor deposition (PEPVD), chambers, plasma enhanced atomic layer deposition (PEALD) cambers, and the like.

Figure 1:
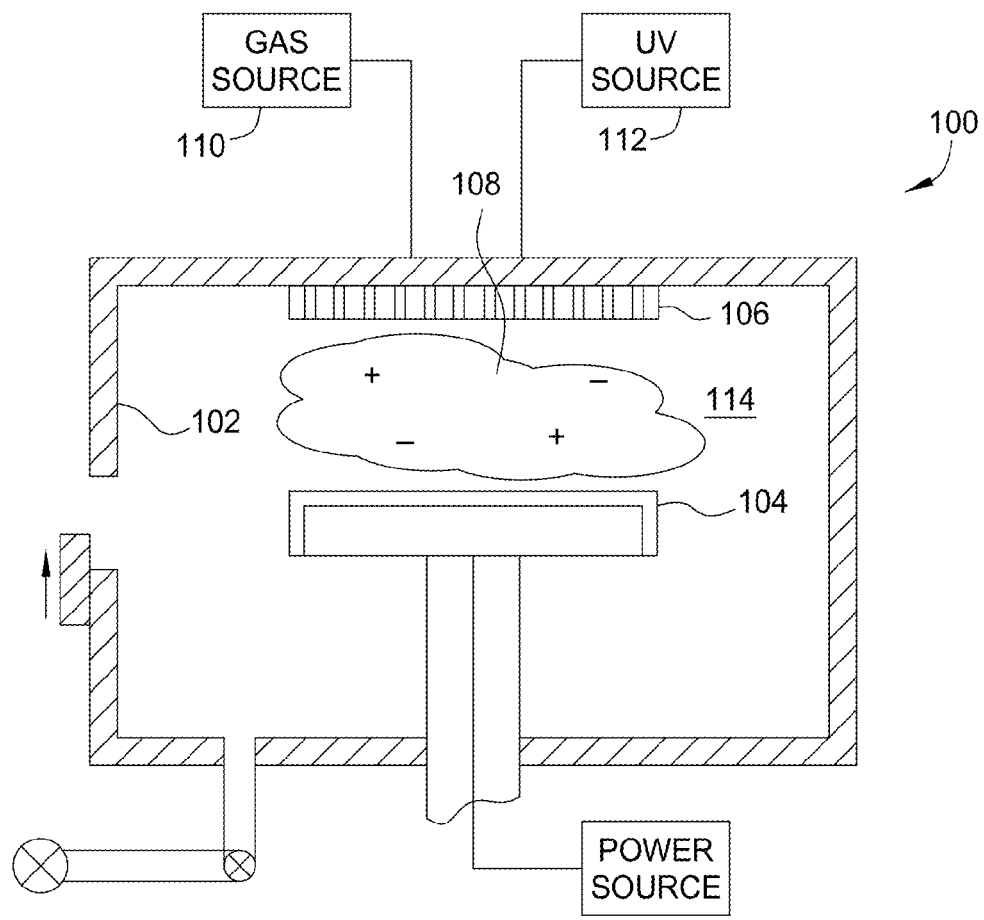
FIG. 1 illustrates a schematic, cross-sectional view of an ultraviolet semiconductor processing chamber according to one embodiment described herein.

FIG. 1 illustrates a schematic, cross-sectional view of a UV semiconductor processing chamber 100. The UV chamber 100 comprises a chamber body 102, a gas source 110, and a UV source 112. The UV source 112 may be configured to process a substrate, for example, by performing curing or ashing processes, and the gas source 110 may be configured to deliver a cleaning gas, such as ozone, to the chamber 100. The gas source 110 may also be configured to provide other gases, such as processing gases and carrier gases, to the chamber 100. Gas provided from the gas source 110 may be provided to a processing region 114 of the chamber 100 via a gas delivery apparatus 106, such as a showerhead, gas port, delivery nozzle, or the like.

The processing region 114, which is defined by the chamber body 102, is subjected to a corrosive environment 108. The corrosive environment 108 may be defined as an environment which promotes particle generation from chamber components 104. For example, photons from the UV source 112 and oxygen radicals derived from ozone provided from the gas source 110 may promote formation of the corrosive environment 108. Chamber components 104 may include a pedestal, susceptor, lift pin, liner, heater, electrostatic chuck, shield, edge ring, showerhead, dome, chamber walls, or other chamber component.

Examples of suitable processing chambers include the PRODUCER® NANOCURE™ 3 UV CURE system and the PRODUCER® ONYX™ system, both available from Applied Materials, Inc., of Santa Clara, Calif. It is contemplated that other suitably adapted chambers and systems from other manufacturers may also benefit from the embodiments described herein.

Figure 2:
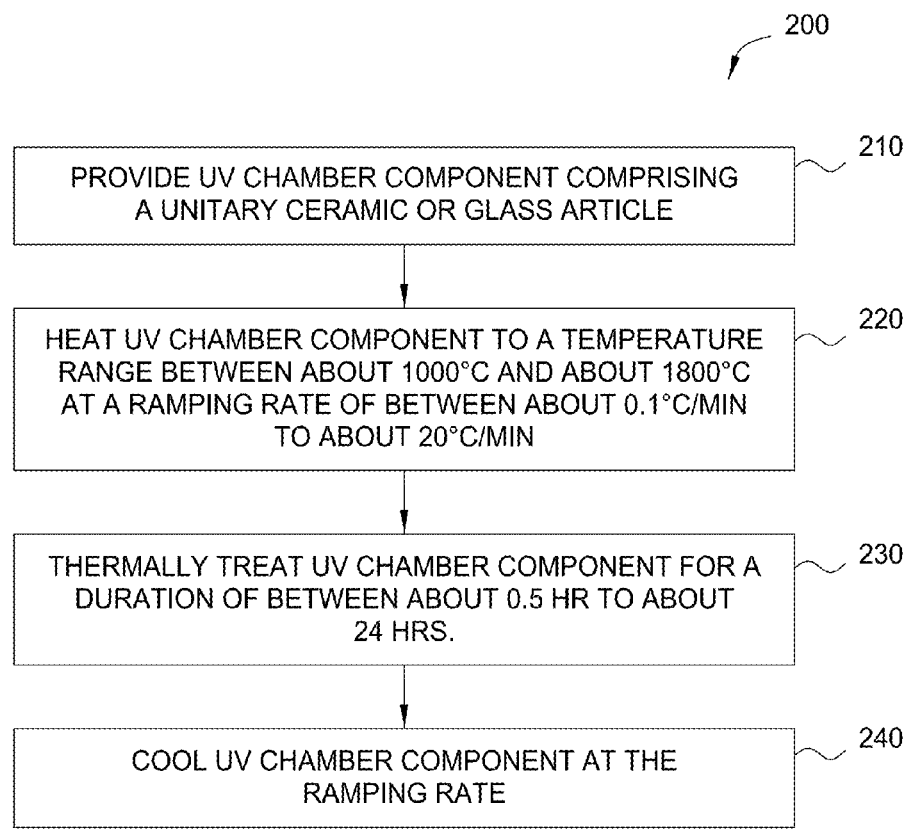
FIG. 2 illustrates diagram of a method according to one embodiment described herein.

FIG. 2 illustrates a method 200 for thermally treating chamber components. At operation 210, a UV chamber component comprising a unitary ceramic or glass article is provided. A unitary article, as defined herein, may be a single piece of ceramic or glass which has no coatings disposed thereon. The terms "UV chamber component" and "unitary ceramic or glass article" are used interchangeably through the description below.

At operation 210, the chamber component may be provided to a furnace, such as a kiln. The furnace includes a thermally insulated chamber, or oven, capable of applying a controlled temperature on the UV chamber components inserted therein. In one embodiment, the thermally insulated chamber of the furnace may be hermitically sealed. The furnace may include a pump to pump air out of the thermally insulated chamber, and thus create a vacuum within the thermally insulated chamber. In addition, the furnace may include a gas inlet to pump gases, such as argon, nitrogen, helium, etc., into the thermally insulated chamber. The furnace may be capable of performing a process recipe, which controls ramp up rates, ramp down rates, process times, temperatures, pressure, gas flows and the like.

The UV chamber component comprising a unitary ceramic or glass article provided to the furnace may be formed from various bulk materials. In one example, a unitary ceramic article is provided and may be formed from ceramics such as $Al_2O_3$, AlN, AlON, SiC, $Si_3N_4$, SiCN, Si—SiC, $ZrO_2$, $Y_2O_3$, $Y_2O_3$ doped $ZrO_2$, $Y_2O_3$ based ceramics, $Er_2O_3$, and combinations thereof. In another example, a unitary glass article is provided and may be formed from glasses such as quartz, aluminosilicate glass, borosilicate glass, rare earth doped silicate glass, nitride glass, and combinations thereof. Ceramic and glass unitary articles comprising oxides may be thermally treated in the furnace in an ambient air environment, which may be an oxidizing environment. Ceramic and glass unitary articles comprising non-oxides, such as carbides or nitrides, may be thermally treated in the furnace in a non-oxidizing environment. For example, nitrogen, helium, argon, and combinations thereof may be provided to the furnace to create a non-oxidizing environment to prevent oxidization of the non-oxide unitary ceramic or glass articles.

The UV chamber component may also be machined prior to providing the UV chamber component to the furnace. Examples of machining include surface grinding, polishing, drilling, abrading, cutting, bead blasting, or otherwise processing the UV chamber component. The machining of the UV chamber component prior to thermal treatment may cause particles to be present on the surface of the UV chamber component. Particles present on the surface of the UV chamber component may either be cleaned from the surface or remain on the surface prior to inserting the chamber component into the furnace. In one embodiment, a surface roughness $R_a$ (µin), which may be formed by the machining, of the unitary ceramic or glass article is less than about 65 µin, such as about 40 µin. It is contemplated that the surface roughness $R_a$ of the unitary ceramic or glass article may further reduce the prevalence of particle creation in combination with the thermal treatment.

At operation 220, the UV chamber component is heated to a temperature range between about 1000° C. and about 1800° C. at a first ramping rate of between about 0.1° C./minute to about 20° C./minute. The unitary ceramic or glass article may be fragile, and may crack when exposed to extreme changed in temperature. Accordingly, the ramping rate is slow enough to prevent the unitary ceramic or glass article from cracking or otherwise losing structural integrity. It is contemplated that for some unitary ceramic or glass articles, a ramping rate of greater than about 20° C./minute may be utilized. Thus, in some embodiments, ramping rates beyond 20° C./minute that do not cause cracking may be utilized.

The temperature changes that cause a unitary ceramic or glass article to crack may depend on the composition of the unitary ceramic or glass article. For example, $Al_2O_3$ may be heated at a rate of 10° C./minute or more without cracking. However, $Y_2O_3$ may crack if heated at a ramping rate that is greater than about 5° C./minute. In one embodiment, a ramping rate of between about 0.1° C./minute and about 5°

C./minute, such as about 2° C./minute, may be utilized for a unitary ceramic article comprising $Al_2O_3$. Typically, the unitary ceramic or glass article will start at or near ambient temperature and be slowly heated at the ramping rate to a predetermined temperature. In one embodiment, an $Al_2O_3$ unitary article is heated to a temperature of between about 1300° C. and about 1500° C., such as about 1400° C.

At operation 230, the UV chamber component is thermally treated at one or more temperatures within the temperature range for a duration of between about 0.5 hours to about 24 hours. In one embodiment, the temperature range is between about 1 hour and about 4 hours, such as about 2 hours. The specific duration utilized may depend on a composition of the unitary ceramic or glass article, as well as the desired performance properties of the unitary ceramic or glass article. In one embodiment, the unitary ceramic or glass article is maintained at a single temperature for the duration of the thermal treatment. Alternatively, the unitary ceramic or glass article may be heated and/or cooled to multiple different temperatures within the temperature range during the thermal treatment. For example, the unitary ceramic or glass article may be thermally treated at a first temperature for a first duration and may then be thermally treated at a second temperature for a second duration. When multiple different thermal treatment temperatures are utilized, the unitary ceramic or glass article may be heated and/or cooled at the ramping rate to transition between the first and second temperatures.

At operation 240, the UV chamber component is cooled at a second ramping rate of between about 0.1° C./minute and about 20° C./minute. In one embodiment, the unitary ceramic or glass article is cooled at the same ramping rate as the ramping rate used to heat the unitary ceramic or glass article. In another embodiment, a different ramping rate is utilized to cool the unitary ceramic or glass article than was utilized to heat the unitary ceramic or glass article. For certain unitary ceramic or glass articles, it may be possible to cool the article at a rate greater than the ramping rate below a threshold temperature, such as about 100° C.

As a result of the thermal treatment, the UV chamber component may exhibit improved performance with regard to particle contamination and UV and oxygen radical resistance. In general, the thermal treatment method 200 may be performed prior to utilization of the UV chamber component in a UV processing chamber. Alternatively, the thermal treatment method 200 may be performed on a UV chamber component which has previously been used in a UV processing chamber.

As previously described, the exposure to UV energy and oxygen radicals may generate particles that can contaminate semiconductor devices. The thermal treatment method 200 may reduce the prevalence of particle generation on newly manufactured UV chamber components or may heal defects and reduce the prevalence of particle generation for used UV chamber components. Thus, the thermal treatment method 200 may be used to prepare or repair a UV chamber component and prolong the useful life of the UV chamber component. It is contemplated that the temperature and/or duration of the thermal treatment method 200 used for subsequent thermal treatment processes may be different from a temperature and/or duration used to an initial thermal treatment process.

Figure 3:
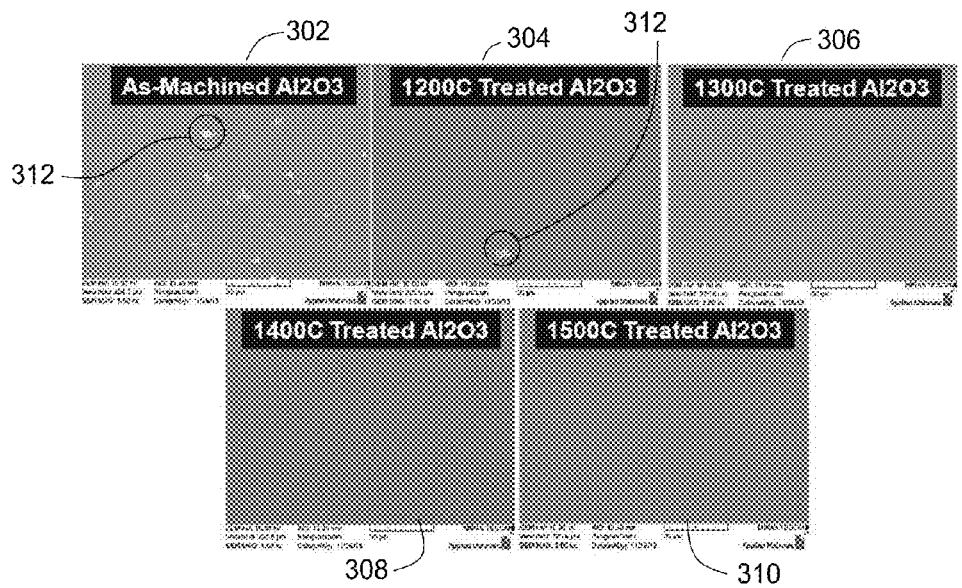
FIG. 3 illustrates a micrograph of a tape particle collection from a UV chamber component before and after thermal treatment at different temperatures according to various embodiments described herein.

FIG. 3 illustrates micrographs 302-310 of a UV chamber component surface particle collection before and after thermal treatment at different temperatures. A polyimide tape, such as KAPTON® tape, which was applied to a unitary $Al_2O_3$ article, is shown in micrographs 302-310 at 4,000× magnification. The tape particle collection test may be performed by attaching an adhesive tape to the unitary $Al_2O_3$ article, peeling the tape off, and counting a number of particles adhered to the tape. Micrograph 302 illustrates a sample of the tape prior to thermal treatment. Particles 312, which are present on the surface of the article, are generally undesirable and the thermal treatment method 200 is utilized to reduce or eliminate the presence of particles 312 from the article.

Micrograph 304 illustrates the tape particle collection from the unitary $Al_2O_3$ article after thermal treatment at 1200° C. As illustrated, the amount of particles 312 present on the tape are greatly reduced, however some particles 312 may still be collected from the unitary $Al_2O_3$ article. Micrographs 306, 308, 310 illustrate the tape particle collection from the unitary $Al_2O_3$ article after thermal treatment at temperatures of 1300° C., 1400° C., and 1500° C., respectively. The presence of particles on the tape in micrographs 306, 308, 310 is essentially non-existent due to the thermal treatment of the unitary $Al_2O_3$ article.

Figure 4A:
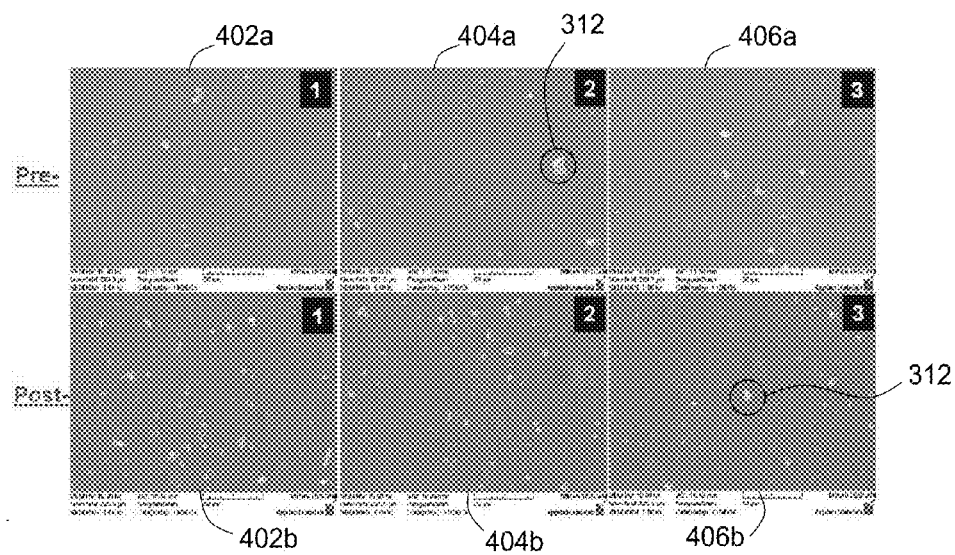
FIGS. 4A-4E illustrate micrographs of a tape particle collection from thermally treated UV chamber components at different temperatures before and after exposure to a corrosive environment accordingly to various embodiments described herein.

FIG. 4A illustrates micrographs 402-406 of the tape particle collection a unitary $Al_2O_3$ article prior to and after exposure to the corrosive environment. Micrographs 402a, 404a, and 406a illustrate tape particle collection from various regions of a non-thermally treated unitary $Al_2O_3$ article before exposure to a corrosive environment. As illustrated, particles 312 were collected on the tape. FIGS. 402b, 404b, and 406b illustrate tape particle collection from the same regions of micrographs 402a, 404a, and 406a, respectively, after exposure to the corrosive environment. As illustrated, particles 312 were collected on the tape.

For the tests represented in FIGS. 4A-4E, the unitary $Al_2O_3$ article was processed in a UV processing chamber by placing the unitary $Al_2O_3$ article on a heater in the chamber. The heater temperature was oscillated between ambient temperature and 200° C. for 825 heating cycles. During or after at least one of the cycles an ozone clean process was performed. The ozone clean process lasted for a duration of 300 seconds during which 12.5 wt % ozone was provided to the UV processing chamber at 10 slm. Subsequently, helium and argon were each provided to the UV processing chamber at 16 slm to purge the UV processing chamber. The purging process had a duration of 10 seconds. The pressure of the UV processing chamber during the purging process was 3 Torr. The above conditions simulated a corrosive environment which may include UV energy and oxygen radicals.

Figure 4B:
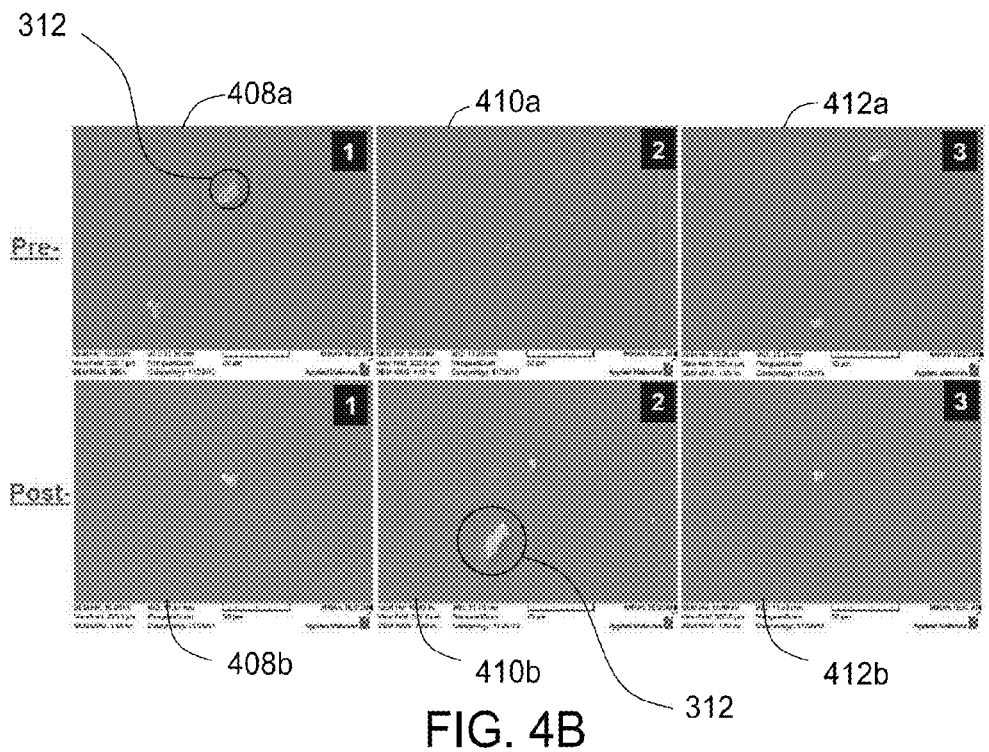

FIGS. 4B-4E illustrate micrographs of tape particle collections for thermally treated UV chamber components at different temperatures before and after exposure to a corrosive environment. FIG. 4B illustrates micrographs 408-412 of the tape particle collection for the unitary $Al_2O_3$ article prior to and after exposure to the corrosive environment. Micrographs 408a, 410a, and 412a illustrate tape particle collection from various regions of a thermally treated unitary $Al_2O_3$ article at 1200° C. before exposure to the corrosive environment. As illustrated, particles 312 were collected on the tape before exposure to the corrosive environment. FIGS. 408b, 410b, and 412b illustrate tape particle collection from the same regions of micrographs 408a, 410a, and 412a, respectively, after exposure to the corrosive environment. As illustrated, particles 312 were collected on the tape after exposure to the corrosive environment for the 1200° C. thermally treated unitary $Al_2O_3$ article.

Figure 4C:
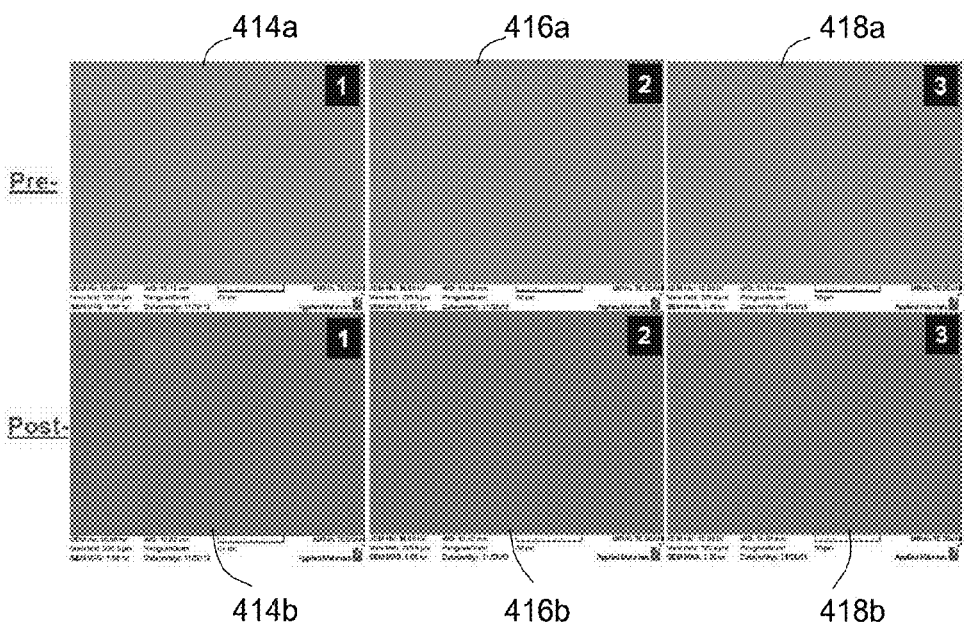

FIG. 4C illustrates micrographs 414-418 of the tape particle collection for the unitary $Al_2O_3$ article prior to and after exposure to the corrosive environment. Micrographs

414*a*, 416*a*, and 418*a* illustrate tape particle collection from various regions of a thermally treated unitary Al$_2$O$_3$ article at 1300° C. before exposure to the corrosive environment. As illustrated, no particles are identifiably present on the tape before exposure to the corrosive environment. FIGS. 414*b*, 416*b*, and 418*b* illustrate tape particle collection from the same regions of micrographs 414*a*, 416*a*, and 418*a*, respectively, after exposure to the corrosive environment. As illustrated, no particles were identifiably present on the tape after exposure to the corrosive environment for the 1300° C. thermally treated unitary Al$_2$O$_3$ article.

Figure 4D:
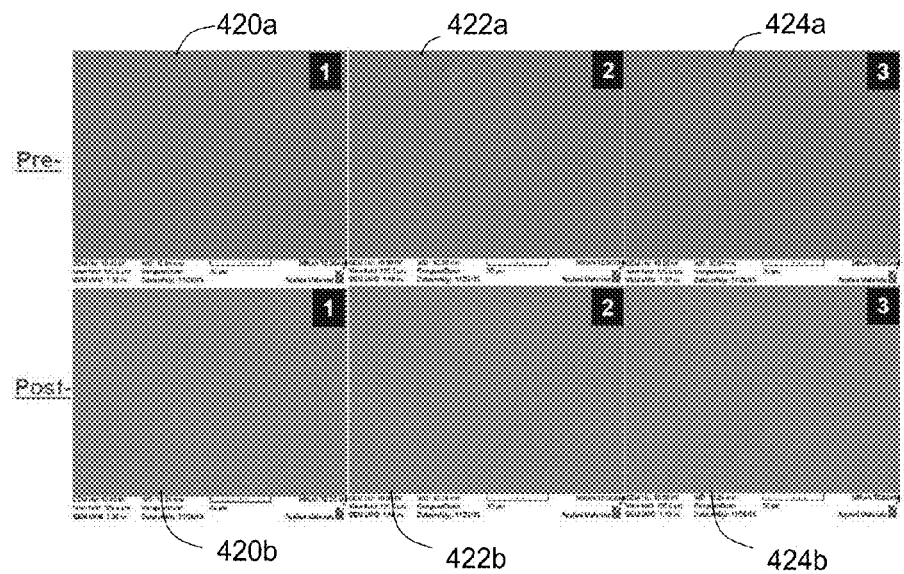

FIG. 4D illustrates micrographs 420-424 of the tape particle collection for the unitary Al$_2$O$_3$ article prior to and after exposure to the corrosive environment. Micrographs 420*a*, 422*a*, and 424*a* illustrate tape particle collection from various regions of a thermally treated unitary Al$_2$O$_3$ article at 1400° C. before exposure to the corrosive environment. As illustrated, no particles are identifiably present on the tape before exposure to the corrosive environment. FIGS. 420*b*, 422*b*, and 424*b* illustrate tape particle collection from the same regions of micrographs 420*a*, 422*a*, and 424*a*, respectively, after exposure to the corrosive environment. As illustrated, no particles were identifiably present on the tape after exposure to the corrosive environment for the 1400° C. thermally treated unitary Al$_2$O$_3$ article.

Figure 4E:
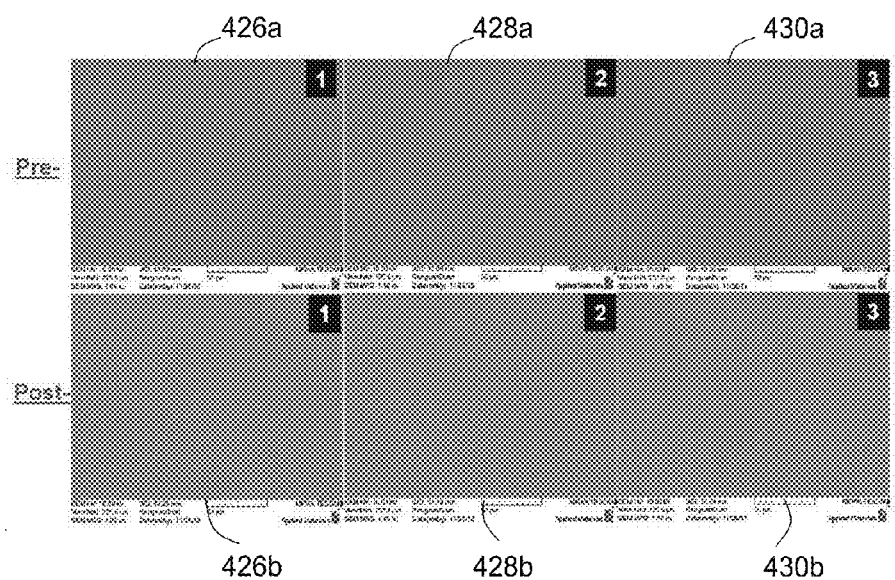

FIG. 4E illustrates micrographs 426-430 of the tape particle collection for the unitary Al$_2$O$_3$ article prior to and after exposure to the corrosive environment. Micrographs 426*a*, 428*a*, and 430*a* illustrate tape particle collection from various regions of a thermally treated unitary Al$_2$O$_3$ article at 1500° C. before exposure to the corrosive environment. As illustrated, no particles are identifiably present on the tape before exposure to the corrosive environment. FIGS. 426*b*, 428*b*, and 430*b* illustrate tape particle collection from the same regions of micrographs 426*a*, 428*a*, and 430*a*, respectively, after exposure to the corrosive environment. As illustrated, no particles were identifiably present on the tape after exposure to the corrosive environment for the 1500° C. thermally treated unitary Al$_2$O$_3$ article.

FIGS. 4B-4E illustrate that a corrosive environment, such as UV energy or ozone (oxygen radicals), has essentially no effect on the unitary Al$_2$O$_3$ article. Thus, it is believed that thermal treatment of UV chamber components reduces or eliminates the prevalence of particle generation and may increase the useful lifetime of the UV chamber article while improving defect-free device yield.

Figure 5:
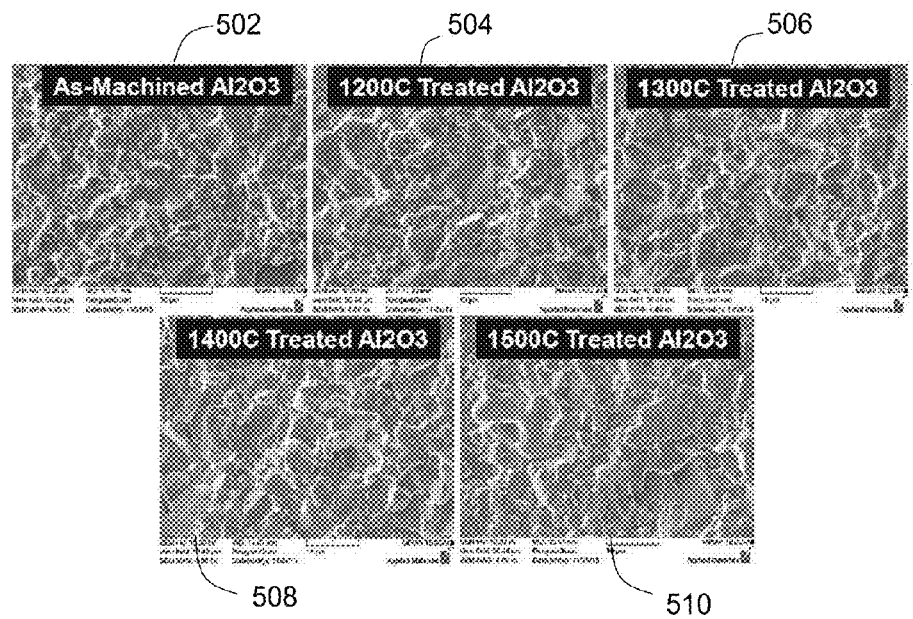
FIG. 5 illustrates a surface morphology micrograph of a UV chamber component before and after thermal treatment at different temperatures according to various embodiments described herein.

FIG. 5 illustrates surface morphology micrographs 502-510 of a UV chamber component before and after thermal treatment at different temperatures. The micrographs 502-510 illustrate the surface of a unitary Al$_2$O$_3$ article at 4,000× magnification. Surface morphology of the unitary Al$_2$O$_3$ article may be represented using surface roughness R$_a$ parameters and/or surface uniformity parameters. The surface morphology may also be represented using porosity, cracking and/or void parameters. Measured parameters that represent porosity may include a port count and/or average pore size. Similarly, measured parameters that represent voids and/or cracking may include an average void/crack size and/or void/crack count. It is contemplated that the surface roughness of the unitary Al$_2$O$_3$ article may have a reduced surface roughness R$_a$ as a result of thermal treatment. The reduced surface roughness may also reduce the prevalence of particle generation from ceramic or glass UV chamber components.

Micrograph 502 illustrates the surface morphology of the unitary Al$_2$O$_3$ article prior to thermal treatment. Micrographs 504 and 506 illustrate the surface morphology of the unitary Al$_2$O$_3$ article after thermal treatment at 1200° C. and 1300° C., respectively. As illustrated, there is no appreciable change in the surface morphology when comparing the micrographs 504, 506 and micrograph 502. Micrograph 508 illustrates the unitary Al$_2$O$_3$ article after thermal treatment at 1400° C. As illustrated, the thermal treatment slightly changes the surface morphology of the unitary Al$_2$O$_3$ article when compared to the micrograph 502, although it is believed that the change in surface morphology is negligible. Micrograph 510 illustrates the unitary Al$_2$O$_3$ article after thermal treatment at 1500° C. As illustrated, the thermal treatment greatly changes the surface morphology of the unitary Al$_2$O$_3$ article when compared to the micrograph 502. Thus, thermal treatment of UV chamber components at temperatures less than about 1400° C. may maintain the structural integrity and machining tolerances of the UV chamber components.

Figure 6A:
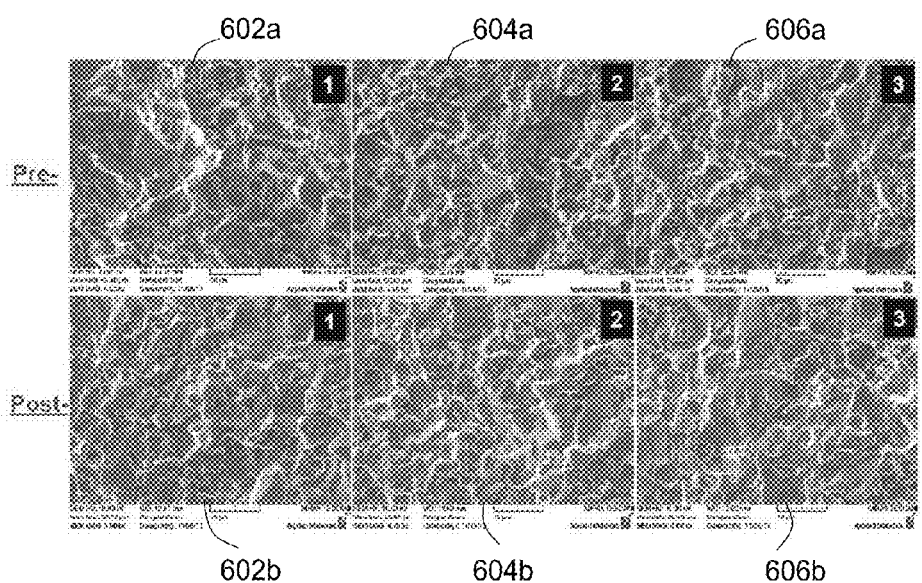
FIGS. 6A-6E illustrate surface morphology micrographs of thermally treated UV chamber components at different temperatures before and after exposure to a corrosive environment according to various embodiments described herein.

FIG. 6A illustrates surface morphology micrographs 602-606. Micrographs 602*a*, 604*a*, and 606*a* illustrate surface morphology features from various regions of a non-thermally treated unitary Al$_2$O$_3$ article before exposure to a corrosive environment. The corrosive environment is described in greater detail with regard to FIGS. 4A-4E. FIGS. 602*b*, 604*b*, and 606*b* illustrate the surface morphology features from the same regions of micrographs 602*a*, 604*a*, and 606*a*, respectively, after exposure to the corrosive environment. As illustrated, there are appreciable changes in the surface morphology of the unitary Al$_2$O$_3$ article due to the corrosive environment exposure.

Figure 6B:
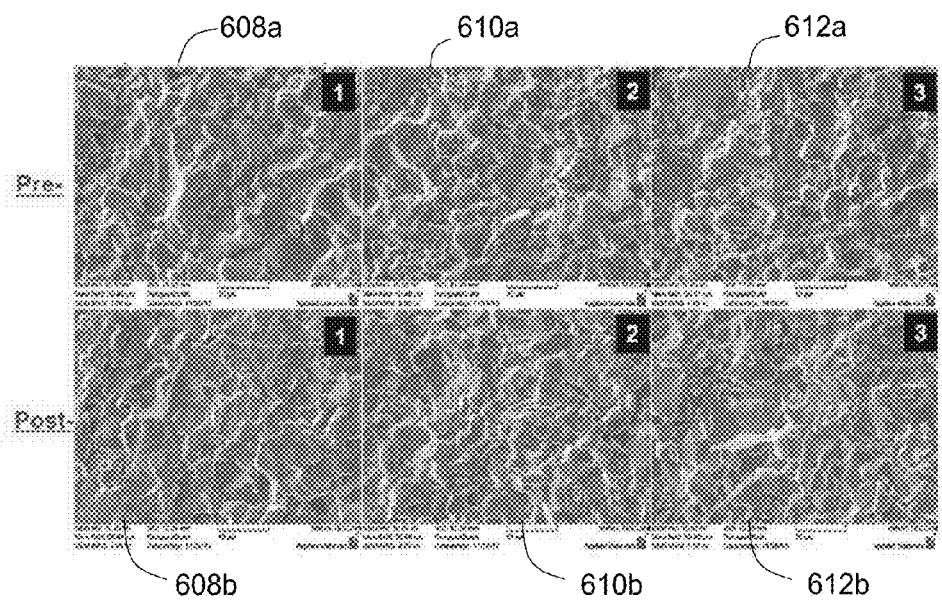

FIGS. 6B-6E illustrate surface morphology micrographs of thermally treated unitary Al$_2$O$_3$ articles at different temperatures before and after exposure to a corrosive environment. FIG. 6B illustrates surface morphology micrographs 608-612 for the unitary Al$_2$O$_3$ article prior to and after exposure to the corrosive environment. Micrographs 608*a*, 610*a*, and 612*a* illustrate surface morphology features from various regions of the thermally treated unitary Al$_2$O$_3$ article at 1200° C. before exposure to the corrosive environment. FIGS. 608*b*, 610*b*, and 612*b* illustrate surface morphology features from the same regions of micrographs 608*a*, 610*a*, and 612*a*, respectively, after exposure to the corrosive environment. As illustrated, exposure to the corrosive environment for the 1200° C. thermally treated unitary Al$_2$O$_3$ article exhibits no obvious change in the surface morphology due to the corrosive environment exposure.

Figure 6C:
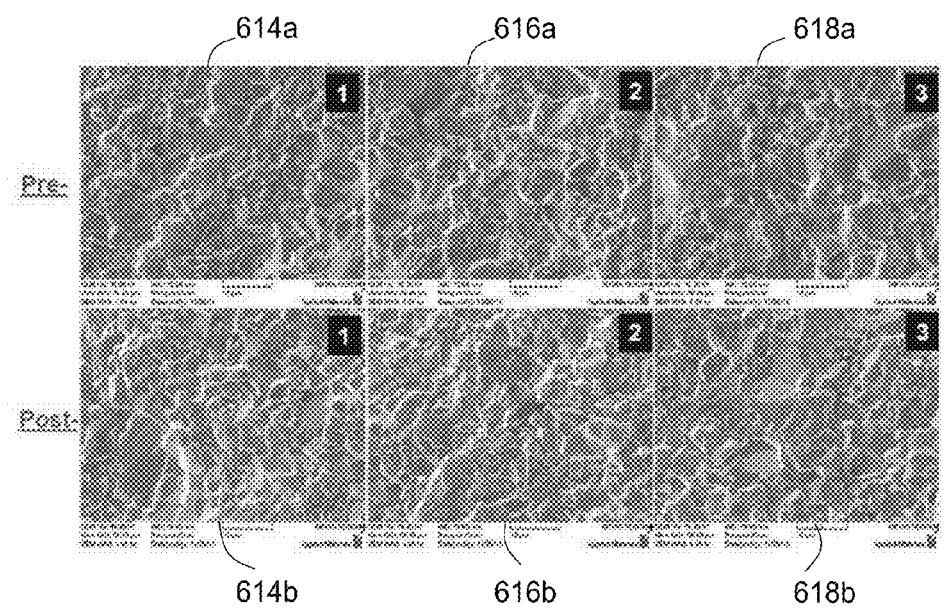

FIG. 6C illustrates surface morphology micrographs 614-618 for the unitary Al$_2$O$_3$ article prior to and after exposure to the corrosive environment. Micrographs 614*a*, 616*a*, and 616*a* illustrate surface morphology features from various regions of the thermally treated unitary Al$_2$O$_3$ article at 1300° C. before exposure to the corrosive environment. FIGS. 614*b*, 616*b*, and 618*b* illustrate surface morphology features from the same regions of micrographs 614*a*, 616*a*, and 618*a*, respectively, after exposure to the corrosive environment. As illustrated, exposure to the corrosive environment for the 1300° C. thermally treated unitary Al$_2$O$_3$ article exhibits no obvious change in the surface morphology due to the corrosive environment exposure.

Figure 6D:
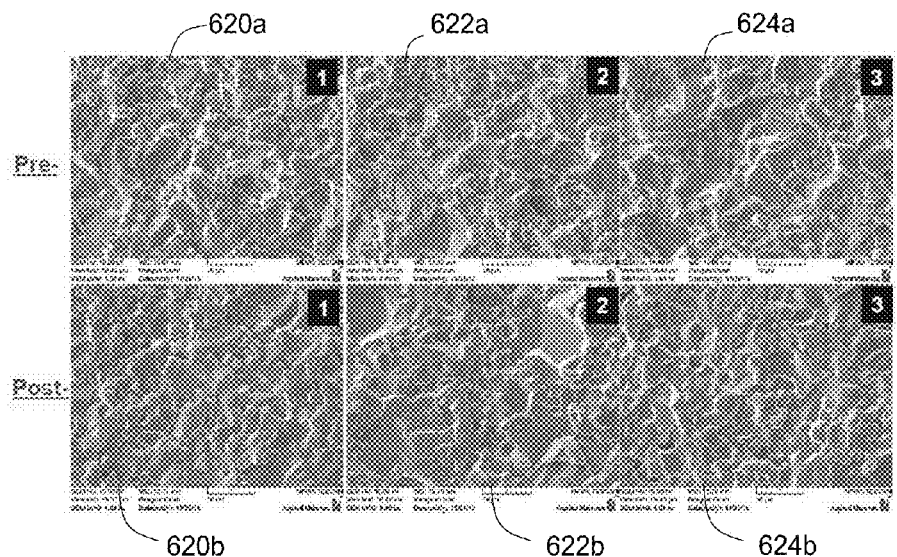

FIG. 6D illustrates surface morphology micrographs 620-624 for the unitary Al$_2$O$_3$ article prior to and after exposure to the corrosive environment. Micrographs 620*a*, 622*a*, and 624*a* illustrate surface morphology features from various regions of the thermally treated unitary Al$_2$O$_3$ article at 1400° C. before exposure to the corrosive environment. FIGS. 620*b*, 622*b*, and 624*b* illustrate surface morphology features from the same regions of micrographs 620*a*, 622*a*, and 624*a*, respectively, after exposure to the corrosive environment. As illustrated, exposure to the corrosive environment for the 1400° C. thermally treated unitary $Al_2O_3$ article exhibits no obvious change in the surface morphology due to the corrosive environment exposure.

Figure 6E:
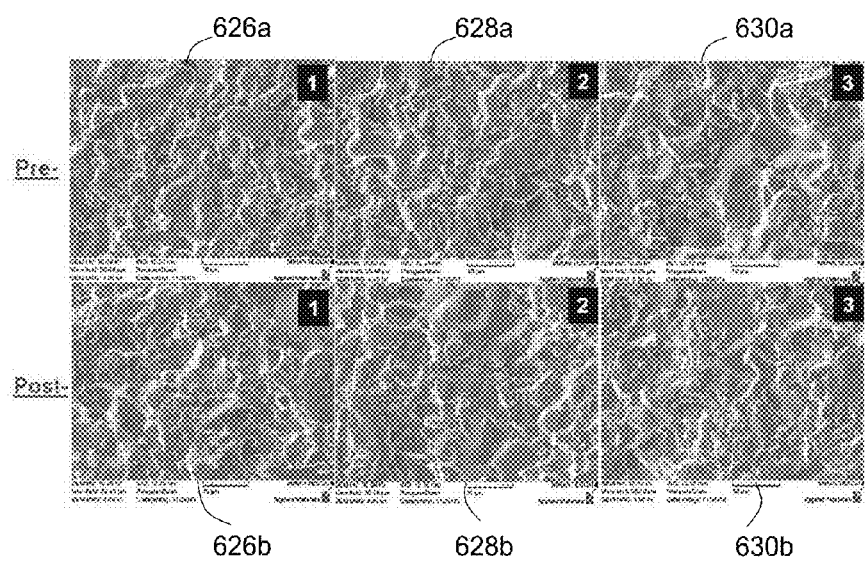

FIG. 6E illustrates surface morphology micrographs 626-630 for the unitary $Al_2O_3$ article prior to and after exposure to the corrosive environment. Micrographs 626a, 628a, and 630a illustrate surface morphology features from various regions of the thermally treated unitary $A_{l2O3}$ article at 1500° C. before exposure to the corrosive environment. FIGS. 626b, 628b, and 630b illustrate surface morphology features from the same regions of micrographs 626a, 628a, and 630a, respectively, after exposure to the corrosive environment. As illustrated, exposure to the corrosive environment for the 1500° C. thermally treated unitary $Al_2O_3$ article exhibits no obvious change in the surface morphology due to the corrosive environment exposure.

In the examples described above, thermal treatment above about 1400° C. may alter the surface morphology of a UV chamber component. However, the exposure to the corrosive environment does not alter the surface morphology. As such, the desired surface morphology for thermally treated UV chamber components may be maintained after repeated exposure to corrosive environments. Additionally, thermal treatment of UV chamber components, such as unitary ceramic or glass articles, may reduce or eliminate the opportunity for particle generation from the surfaces of the UV chamber components.

While the foregoing is directed to embodiments of the present disclosure, other and further embodiments of the disclosure may be devised without departing from the basic scope thereof, and the scope thereof is determined by the claims that follow.

The invention claimed is:

1. A method for thermally treating UV chamber components, comprising:
   providing a unitary ceramic article;
   heating the unitary ceramic article to a temperature range between about 1000° C. and about 1800° C. at a first ramping rate of between about 0.1° C./minute and about 20° C./minute;
   thermally treating the unitary ceramic article for a duration of between about 0.5 hours and about 24 hours; and
   cooling the unitary ceramic article at a second ramping rate of between about 0.1° C./minute and about 20° C./minute.

2. The method of claim 1, wherein the unitary ceramic article comprises a material selected from the group consisting of $Al_2O_3$, AlN, AlON, SiC, $Si_3N_4$, SiCN, Si—SiC, $ZrO_2$, $Y_2O_3$, $Y_2O_3$ doped $ZrO_2$, $Y_2O_3$ based ceramics, $Er_2O_3$, and combinations thereof.

3. The method of claim 2, wherein oxide containing unitary ceramic articles are thermally treated in an ambient air environment.

4. The method of claim 2, wherein non-oxide unitary ceramic articles are thermally treated in a non-oxidizing environment.

5. The method of claim 1, wherein the temperature range is between about 1200° C. and about 1500° C.

6. The method of claim 1, wherein the duration of thermal treatment is between about 1 hour and about 3 hours.

7. The method of claim 1, wherein the first and second ramping rates are selected to prevent cracking of the unitary ceramic article.

8. A method for thermally treating UV chamber components, comprising:
   providing a unitary glass article;
   heating the unitary glass article to a temperature range between about 1000° C. and about 1800° C. at a first ramping rate of between about 0.1° C./minute and about 20° C./minute;
   thermally treating the unitary glass article for a duration of between about 0.5 hours and about 24 hours; and
   cooling the unitary glass article at a second ramping rate of between about 0.1° C./minute and about 20° C./minute.

9. The method of claim 8, wherein the unitary glass article comprises a material selected from the group consisting of quartz, aluminosilicate glass, borosilicate glass, rare earth doped silicate glass, nitride glass, and combinations thereof.

10. The method of claim 9, wherein oxide containing unitary glass articles are thermally treated in an ambient air environment.

11. The method of claim 9, wherein non-oxide unitary glass articles are thermally treated in a non-oxidizing environment.

12. The method of claim 8, wherein the temperature range is between about 1200° C. and about 1500° C.

13. The method of claim 8, wherein the duration of thermal treatment is between about 1 hour and about 3 hours.

14. The method of claim 8, wherein the first and second ramping rates are selected to prevent cracking of the unitary glass article.

15. A thermally treated UV chamber component prepared by a process comprising:
   providing a unitary ceramic or glass article;
   heating the unitary ceramic or glass article to a temperature range between about 1000° C. and about 1800° C. at a first ramping rate of between about 0.1° C./minute and about 20° C./minute;
   thermally treating the unitary ceramic or glass article for a duration of between about 0.5 hours and about 24 hours; and
   cooling the unitary ceramic or glass article at a second ramping rate of between about 0.1° C./minute and about 20° C./minute.

16. The thermally treated UV chamber component of claim 15, wherein the unitary ceramic or glass article is selected from the group consisting of $Al_2O_3$, AlN, AlON, SiC, $Si_3N_4$, SiCN, Si—SiC, $ZrO_2$, $Y_2O_3$, $Y_2O_3$ doped $ZrO_2$, $Y_2O_3$ based ceramics, $Er_2O_3$, quartz, aluminosilicate glass, borosilicate glass, rare earth doped silicate glass, nitride glass, and combinations thereof.

17. The thermally treated UV chamber component of claim 15, wherein oxide containing unitary ceramic or glass articles are thermally treated in an ambient air environment.

18. The thermally treated UV chamber component of claim 15, wherein non-oxide unitary ceramic or glass articles are thermally treated in a non-oxidizing environment.

19. The thermally treated UV chamber component of claim 15, wherein the temperature range is between about 1200° C. and about 1500° C.

20. The thermally treated UV chamber component of claim 15, wherein the duration of thermal treatment is between about 1 hour and about 3 hours.

* * * * *